(12) United States Patent
Jiang et al.

(10) Patent No.: US 11,269,329 B2
(45) Date of Patent: Mar. 8, 2022

(54) DYNAMIC MODEL WITH LEARNING BASED LOCALIZATION CORRECTION SYSTEM

(71) Applicant: Baidu USA LLC, Sunnyvale, CA (US)

(72) Inventors: Shu Jiang, Sunnyvale, CA (US); Qi Luo, Sunnyvale, CA (US); Jinghao Miao, Sunnyvale, CA (US); Jiangtao Hu, Sunnyvale, CA (US); Jiaxuan Xu, Sunnyvale, CA (US); Jingao Wang, Sunnyvale, CA (US); Yu Wang, Sunnyvale, CA (US); Jinyun Zhou, Sunnyvale, CA (US); Runxin He, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 317 days.

(21) Appl. No.: 16/659,040

(22) Filed: Oct. 21, 2019

(65) Prior Publication Data
US 2021/0116915 A1 Apr. 22, 2021

(51) Int. Cl.
*G05D 1/00* (2006.01)
*G05D 1/02* (2020.01)
*G06N 5/04* (2006.01)

(52) U.S. Cl.
CPC ......... *G05D 1/0088* (2013.01); *G05D 1/0231* (2013.01); *G06N 5/046* (2013.01); *G05D 2201/0213* (2013.01)

(58) Field of Classification Search
CPC ......... G05D 1/0088; G05D 2201/0213; G06N 5/046
See application file for complete search history.

(56) References Cited

U.S. PATENT DOCUMENTS

| 2015/0210280 A1* | 7/2015 | Agnew | B60W 30/095 |
| | | | 701/48 |
| 2017/0057474 A1* | 3/2017 | Zeng | B60T 7/22 |

* cited by examiner

*Primary Examiner* — Ramsey Refai
(74) *Attorney, Agent, or Firm* — Womble Bond Dickinson (US) LLP (57) ABSTRACT

In one embodiment, a set of parameters representing a first state of an autonomous driving vehicle (ADV) to be simulated and a set of control commands to be issued at a first point in time. In response, a localization predictive model is applied to the set of parameters to determine a first position (e.g., x, y) of the ADV. A localization correction model is applied to the set of parameters to determine a set of localization correction factors (e.g., $\Delta x$, $\Delta y$). The correction factors may represent the errors between the predicted position of the ADV by the localization predictive model and the ground truth measured by sensors of the vehicle. Based on the first position of the ADV and the correction factors, a second position of the ADV is determined as the simulated position of the ADV.

20 Claims, 9 Drawing Sheets

DYNAMIC MODEL WITH LEARNING BASED LOCALIZATION CORRECTION SYSTEM

TECHNICAL FIELD

Embodiments of the present disclosure relate generally to operating autonomous vehicles. More particularly, embodiments of the disclosure relate to determining a position of a vehicle.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Motion planning and control are critical operations in autonomous driving. As part of motion planning and control, a position or localization of the autonomous driving vehicle needs to be determined. Such a position or localization of the autonomous driving vehicle may be determined based on the output of various sensors such as an inertial measurement unit (IMU) or GPS sensor. However, due to measurement errors of the sensors, there is a mismatch between the sensor output and the localization result (e.g., x, y position of the vehicle). Such mismatch may affect the autonomous driving algorithms.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to one embodiment, a set of parameters representing a first state of an autonomous driving vehicle (ADV) to be simulated and a set of control commands to be issued at a first point in time. In response, a localization predictive model is applied to the set of parameters to determine a first position (e.g., x, y) of the ADV. A localization correction model is applied to the set of parameters to determine a set of localization correction factors (e.g., $\Delta x$, $\Delta y$). The correction factors may represent the errors between the predicted position of the ADV by the localization predictive model and the ground truth measured by sensors of the vehicle. Based on the first position of the ADV and the correction factors, a second position of the ADV is determined as the simulated position of the ADV.

In one embodiment, a state of a vehicle includes a speed, an acceleration and an angular velocity of the vehicle at a particular point in time. A control command may be a throttle command, a brake command, or a steering command. The localization correction model was trained based on a large amount of driving statistics data collected from a variety of vehicles. The driving statistics data includes vehicle states (e.g., speeds, positions, accelerations) of the vehicles in response to different control commands issued at different points in time. In one embodiment, the localization correction model is configured to determine a difference between an expected position of a vehicle based on a localization process of an autonomous driving system and an actual position of the vehicle determined based on sensor data obtained from various sensors mounted on the vehicle. The difference between the expected position and the actual position is utilized to calibrate the first position determined by the localization predictive model. The localization predictive model and the localization correction model may be integrated to represent a dynamic model.

Figure 1:
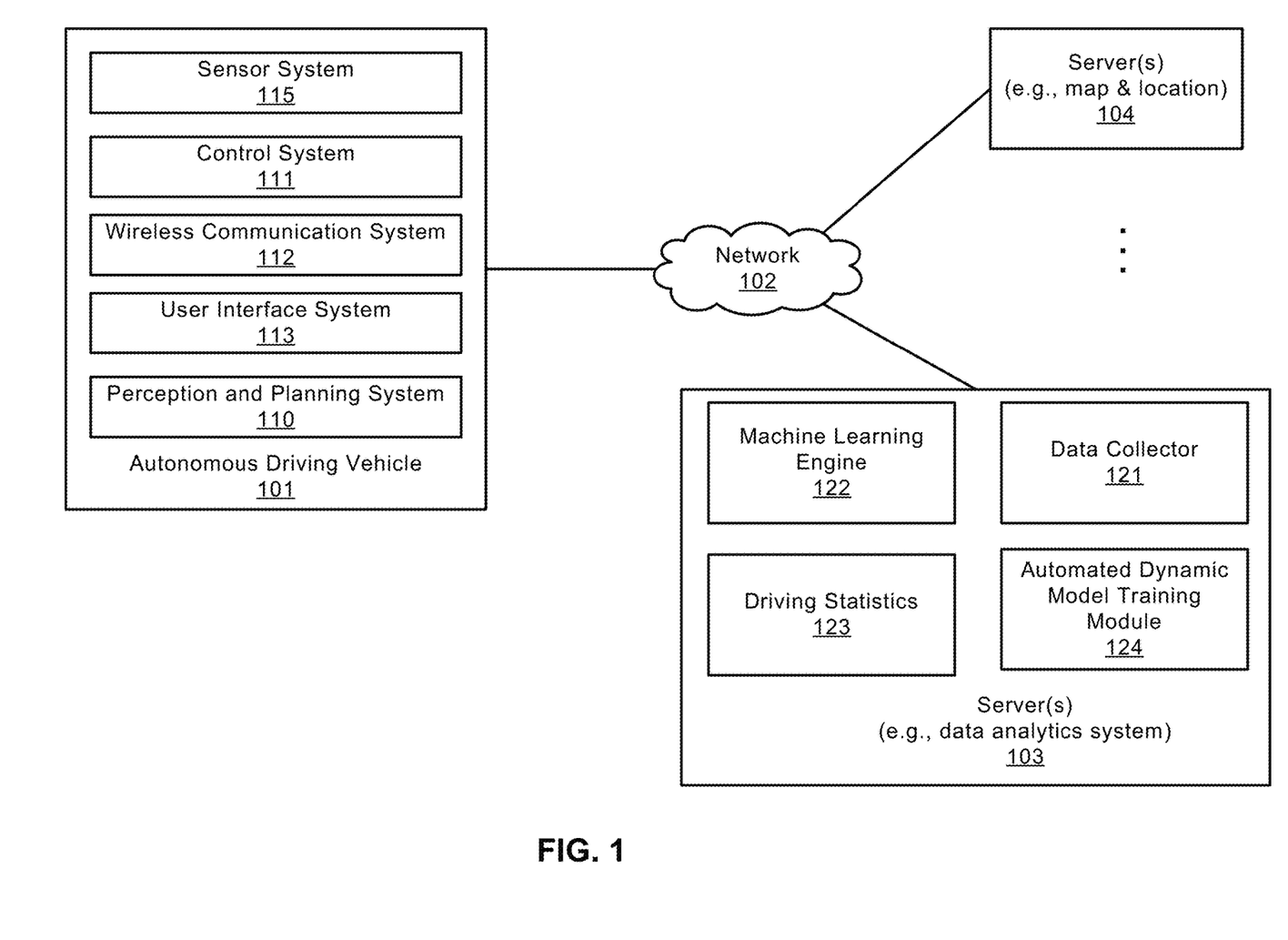
FIG. 1 is a block diagram illustrating a networked system according to one embodiment.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, infotainment system 114, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

In one embodiment, sensor system 115 includes one or more cameras, global positioning system (GPS) unit, inertial measurement unit (IMU), radar unit, and a light detection and range (LIDAR) unit. The sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, the vehicle control system 111 includes a steering unit, throttle unit (also referred to as an acceleration unit), and a braking unit. The steering unit is to adjust the direction or heading of the vehicle. The throttle unit is to control the speed of the motor or engine that in turn control the speed and acceleration of the vehicle. The braking unit is to decelerate the vehicle by providing friction to slow the wheels or tires of the vehicle.

In one embodiment, the wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

Based on driving statistics 123, machine learning engine 122 generates or trains a set of rules, algorithms, and/or predictive models 124 for a variety of purposes. For example, the machine learning engine 122 can train a dynamic model. The dynamic model may include a localization predictive model and a localization correction model integrated therein. An automated dynamic model training model can be provided in the server 103 to control the extraction of training data from the driving statistics 123 and the training of the dynamic model using the extracted driving statistics.

Figure 2:
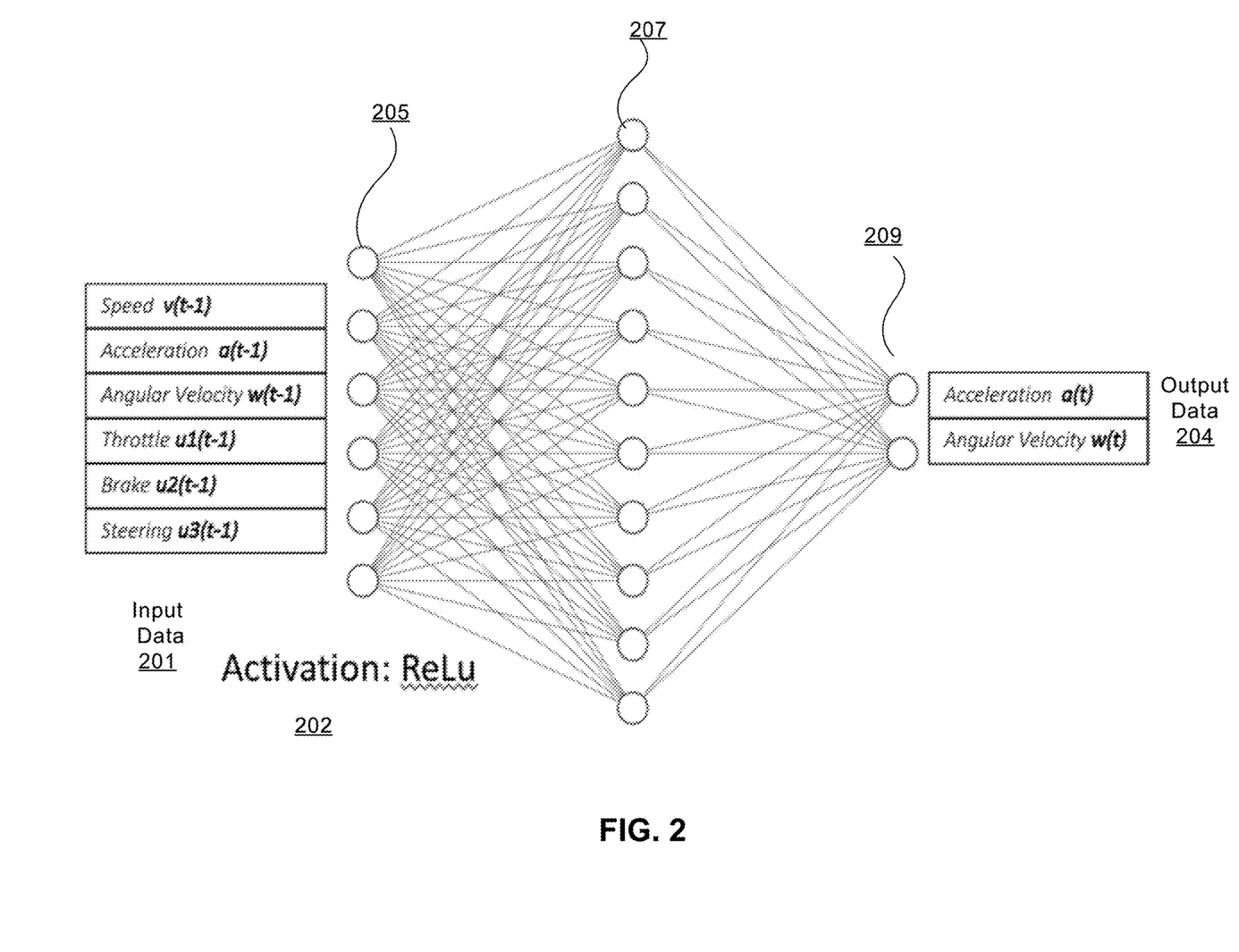
FIG. 2 illustrates an example dynamic model in accordance with an embodiment.

FIG. 2 illustrates an example dynamic model in accordance with an embodiment. In this example, the dynamic model 200 can be a multilayer perceptron (MLP) neural network model trained using real-world data collected by sensors in vehicles. The dynamic model includes a collection of connected neurons designed to model a human brain. Neurons in the dynamic model can be fully connected, with each node in one layer connecting with a certain weight to every node in the following layer. During the training of the dynamic model, the dynamic model changes connection weights after each piece of data is processed based on the amount of error in the output compared to the expected result.

In one embodiment, the dynamic model 200 can include an input layer 205 to receive input data 201, an output layer 209 that makes decisions or predictions or classify about the input data, and an arbitrary number of hidden layers (for example, hidden layer 207) between the input layer 201 and the output layer 209. The hidden layers are the computational engine of the dynamic model 200. Neurons in the hidden layer 207 can include activation functions for transforming the input data 201. Rectified Linear Unit (ReLU) 202 indicates an example activation function used in the dynamic model 200. ReLu 202 returns 0 if it receives any negative input; and for any positive value returns, it returns that value back. Although FIG. 200 shows one hidden layer 207 and one output layer 209, the dynamic model 200 can include multiple hidden layers and multiple output layers.

In an embodiment, the input data 201 for the neural network model 200 includes states of an ADV (e.g., a speed, an acceleration, and an angular velocity), and control commands (e.g., a throttle command, a brake command, and a steering command) for a first driving cycle. The input data 201 can be processed by one or more hidden layers and transformed to the output data 204, which are expected states of the ADV for a second driving cycle. Based on the acceleration and angular velocity over time, the speed of the ADV for the second driving cycle can be computed. The input data represents a number of feature scenarios (i.e. states) of the ADV.

Figure 3:
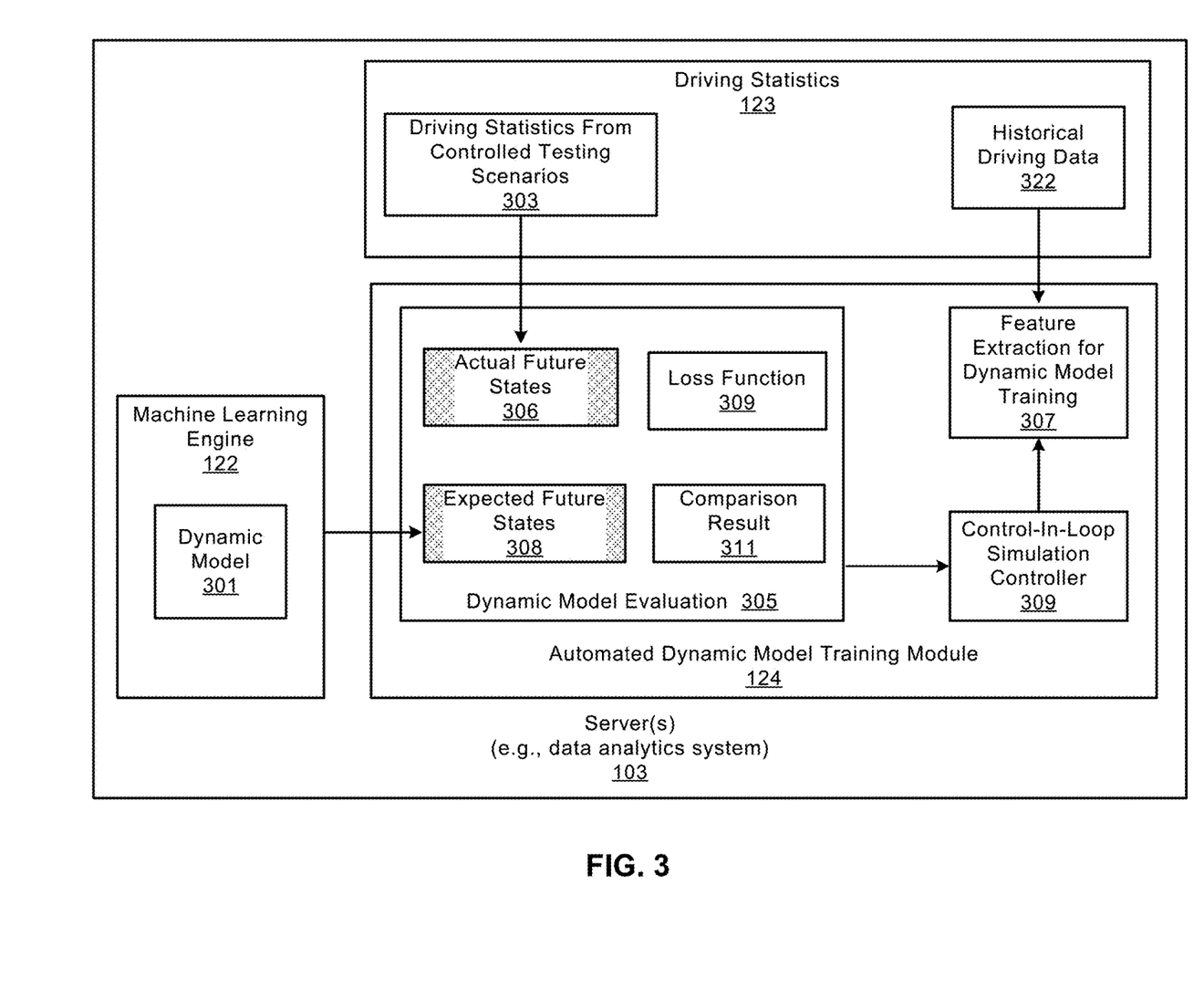
FIG. 3 illustrates an example system 300 for training a dynamic model shown in FIG. 2 in accordance with an embodiment.

FIG. 3 illustrates an example system 300 for training a dynamic model shown in FIG. 2 in accordance with an embodiment. As shown in FIG. 3, the example dynamic training system 300 includes the automated dynamic training module 124, a feature extraction module 307, a training controller 309, historical driving statistics 322, and driving statistics 303 for controlled testing scenarios.

The historical driving statistics 322 includes real-world data collected by sensors (e.g., IMU and GPS) to record real-time dynamics (e.g., states) of vehicles in various scenarios that may cover a variety of road types, obstacle types and road environments. For example, the real-world data can be downloaded from the Apollo Open Data Platform of BAIDU™. The driving statistics 303 for controlled testing scenarios are real-world data generated by vehicles driven by human drivers.

In one embodiment, the training controller 309 can implement an algorithm to automate a process of extracting training data, training a dynamic model using the training data, evaluating the dynamic model iteratively, until the control model meets the specified requirements.

In one embodiment, the training controller 309 can automatically generates a predetermined equally-spaced value ranges for each feature of a number of features. As mentioned above, a feature and a driving parameter can be used interchangeably in this disclosure. For example, for the driving parameter of speed, the training controller 309 can generate the following value ranges: 0-5 mps, 5-10 mps, 10-15 mps, 15-20 mps, and 20-25 mps. From each of the equal-spaced value range, the training controller 309 can extract a value from the historical driving statics 322. In one embodiment, the historical driving statistics 322 can be a subset of the Apollo Open Data Platform of BAIDU™, and can be stored in a data storage that is in synchronization with the Apollo Open Data Platform. Therefore, there can be sufficient data points from each range of values.

Once the value ranges for each driving parameter are determined, the training controller 309 can extract data from each range for that driving parameter to create a number of feature scenarios, each of which represents a value for a driving parameter, or a combination of values for multiple driving parameters (also referred to features or driving features in this disclosure).

As an illustrative example, the training controller 309 can create feature scenarios from, e.g., three driving parameters: steering angle, speed, and accelerator. For each driving parameter, the training controller 309 can create a number of equally-spaced ranges. For example, the simulator controller 309 can create 12 equally-space ranges for steering angle, 5 equally-space ranges for speed, and 7 equally-space ranges for accelerator. In one implementation, a total of 420 of feature scenarios (i.e., 12*5*7=420) would be created using a value from each of the above-mentioned ranges. Different numbers of feature scenarios can be created in other implementations.

In one embodiment, the training controller 309 can invoke the feature extraction module 307 to extract the data for creating the feature scenarios. With the training data for each feature scenario, the training controller 309 can invoke services, functions, routines, libraries, and/or application programming interfaces (APIs) provided by the machine learning engine 122 to train a dynamic model 301. The training controller 309 subsequently can evaluate the dynamic model 301 by performing inferences using data from the driving statistics 303. In one embodiment, the training controller 309 can invoke a dynamic module evaluation module 305 to evaluate the dynamic model 301.

As shown in FIG. 3, the dynamic model 301 can receive, from the driving statistics 303, data generated from a number of controlled testing scenarios. Unlike testing data that are generated by vehicles operated in a natural way, the data generated from the controlled testing scenarios can be data generated by a vehicle under a variety of driving scenarios or driving conditions, which are specifically created for the purpose of generating testing data for those driving conditions or driving scenarios.

In one embodiment, the testing data can include ground truth values for a number of carefully designed controlled testing scenarios to test the performance of the training dynamic model 30. A controlled testing scenario is a feature scenario. One or more controlled testing scenarios are designed for each feature of For example, one controlled testing scenarios would be to turn the steering 180 degrees to the left, another controlling testing scenario would be to turn the steering wheel 180 degree to the right, and yet another controlled testing scenario would be to drive from point A to point B in one minute. For each of the controlled testing scenarios, a ground truth value is recorded in the driving statistics 303, which also store an output of the dynamic model 301 for each of the controlling testing scenarios.

In one embodiment, the driving statistics can include current states of a vehicle and one or more control commands. Examples of the current states include a speed, an acceleration, and an angular velocity of the ADV for a first driving cycle; examples of the control commands include a throttle command, a brake command and a steering command for the first driving cycle. Each current state can have a corresponding expected future state 308 and an actual future state 306 for a second driving cycle. The corresponding expected future state can be the output of the dynamic model 301, while the actual future state 307 can be the ground truth value from the real-world data generated under the controlled testing scenarios.

In an embodiment, the dynamic model evaluation module 305 can compare each actual future state and each expected future state using a loss function 310 to generate a comparison result 311. The dynamic model evaluation module 305 can grade the inference performance of the dynamic model 301 for each feature scenario based on the comparison result 311 and/or the loss function 310.

In one embodiment, each feature scenario can include values for multiple features or a value for one feature. For example, a feature scenario can be a speed of 5 miles per second; a speed of 5 miles per second, a steering angle of 5 degrees to the left; or a speed of 5 miles per second, a steering angle of 5 degrees to the left, and a throttle rate of 15%. Thus, each feature scenario can be associated with one or more features. For all feature scenarios associated with a particular feature, a root mean squared error can be computed based on the comparison result between the ground truth value and an expected value from the dynamic model. A performance score can be calculated using a predetermined algorithm for each root mean squared error for each feature.

Based on the performance scores, the number of features associated with the controlled testing scenarios can be ranked. The training controller 309 can identify one or more features that receive a score lower than a predetermined threshold, and extract additional data using the feature extraction module 307 from the historical driving data 322 for the one or more features to retrain the dynamic model 301. After the retraining using the additional data, the dynamic model evaluation module 305 can be invoked again to evaluate the performance of the dynamic model 301 for the one or more features. The process can be automatically repeated until the dynamic model 301 has met the predetermined requirements for each of the features that are used to train the dynamic model 301 and for which the controlled testing scenarios have been designed.

In one embodiment, the above process of identifying one or more features that receive the lower score than the predetermined threshold can be used to identify one or more features scenarios that receive a score lower than the predetermined threshold. Similarly, the feature extraction module 307 can extract additional data from the for the one or more feature scenarios to retrain the dynamic model 301. After the retraining using the additional data, the dynamic model evaluation module 305 can be invoked again to evaluate the performance of the dynamic model 301 for the one or more feature scenarios. The process can be automatically repeated until the dynamic model 301 has met the predetermined requirements for each of the feature scenarios that have been previously created.

Figure 4:
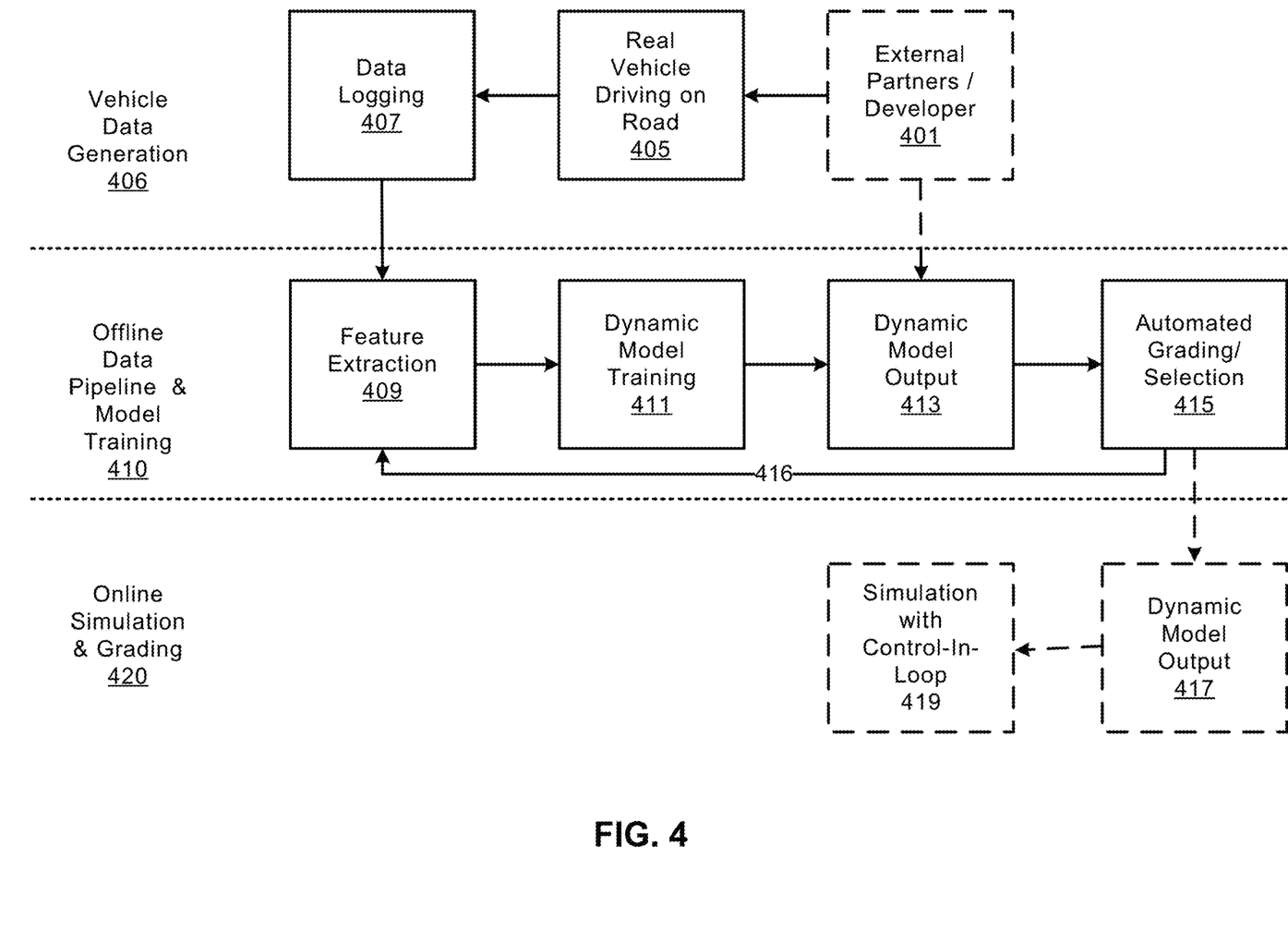
FIG. 4 illustrates an example flow diagram of training a dynamic model in accordance with an embodiment.

FIG. 4 illustrates an example flow diagram 400 of training a dynamic model in accordance with an embodiment. As shown in FIG. 4, an automatic loop of training a dynamic model can include a vehicle data generation 406 phase and an offline data and pipeline & model training phase 410. Once the dynamic model is fully trained and meet all the predefined requirements, the dynamic model can be put into a simulator fine-tune actuators and design control algorithms for use in real-time autonomous driving in an online simulation & grading phase 420.

More specifically, during the vehicle data generation phase 406, external partners or dynamic model developers 401 can collect real-world driving statistics by manually driving vehicles on roads 405, and log the driving statistics in a machine learning training datasets storage, such as the Apollo Open Data Platform of BAIDU™.

During the offline data pipeline and model training phase 410, data for predefined feature scenarios 409 associated with a set of pre-defined features are extracted to be used for training a number of dynamic models 411. Once the dynamic models are trained, the dynamic models can be evaluated offline using historical driving statistics. Based on the outputs 413 of the dynamic models and the ground truths, dynamic models can be graded and a dynamic model with the highest score can be selected 415.

In one embodiment, the selected dynamic model can be evaluated again against driving statistics from a number of controlled testing scenarios so that the dynamic model can be further refined. The controlled testing scenarios can represent a variety of combinations of values from driving parameter of ADV for which the dynamic model has been trained.

Examples of the driving parameters can include braking, accelerating, idle speeding, reverse driving, driving straight, left turn or right turn, U-turn, lane changing, and parking driving. Each driving parameter can have multiple values. A value from one parameter or a combination of values from multiple parameters constitutes a controlling testing scenario.

Inferences can be performed by the dynamic model using driving statistics from the controlled testing scenarios. Outputs of the dynamic model can be compared with the ground truths for each controlled testing scenario. The performance of the dynamic model on each controlled testing scenario can be graded, and those controlled testing scenarios that receive a score below a predetermined threshold will be identified.

Further, based on the performance scores of the controlled testing scenarios, driving parameters or features used to train the dynamic model can also be ranked, and one or more features for which the dynamic model fails to reach a predetermined performance threshold can be identified. The first steps for ranking the features includes determining all the controlled feature scenarios for a feature; comparing the ground truth values for each controlled feature scenario and the expected value generated by the dynamic model in response to receiving that controlled feature scenario as an input; calculating the root mean squared errors or transformed values thereof (e.g., performance scores based on the root mean squared errors); ranking the features based on the root mean squared errors or transformed values; and identifying one or more features that each receive a performance score lower than a predetermined threshold.

After the one or more features or one or more feature scenarios are identified, the automatic loop of training the dynamic model can continue by extracting 409 additional data from historical driving statistics, such as those logged by the data logging 407, for use in retraining the dynamic model. The above process can be repeated iteratively until the dynamic model performs satisfactorily according to a set of predetermined requirements, e.g., no feature scenario receives a score lower than 90 out of 100.

The dynamic model is specifically trained for autonomously driving a particular ADV or a particular type or model of ADV. The dynamic model can be a neural network model, which may be represented by a linear regression, multilayer perception, or recurrent neural network model. The driving statistics collected from various vehicles can include various control commands (e.g., throttle, brake, steering commands) issued and responses or states of the vehicles at different points in time.

As shown in FIG. 4, in the online simulation and grading phase 420, the trained dynamic model can be put into a simulator, where a simulation with control-in-loop process 419 can be implemented to identify issues from outputs 417 of the dynamic model for use in determining whether future training of the dynamic model is needed. Note that vehicle data generation phase 406, offline model training phase 410, and simulation phase 420 may be performed in different computing nodes, such as, for example, different cloud servers. Alternatively, they can be performed by different nodes of a cluster (e.g., application servers or backend servers behind a Web server).

Figure 5:
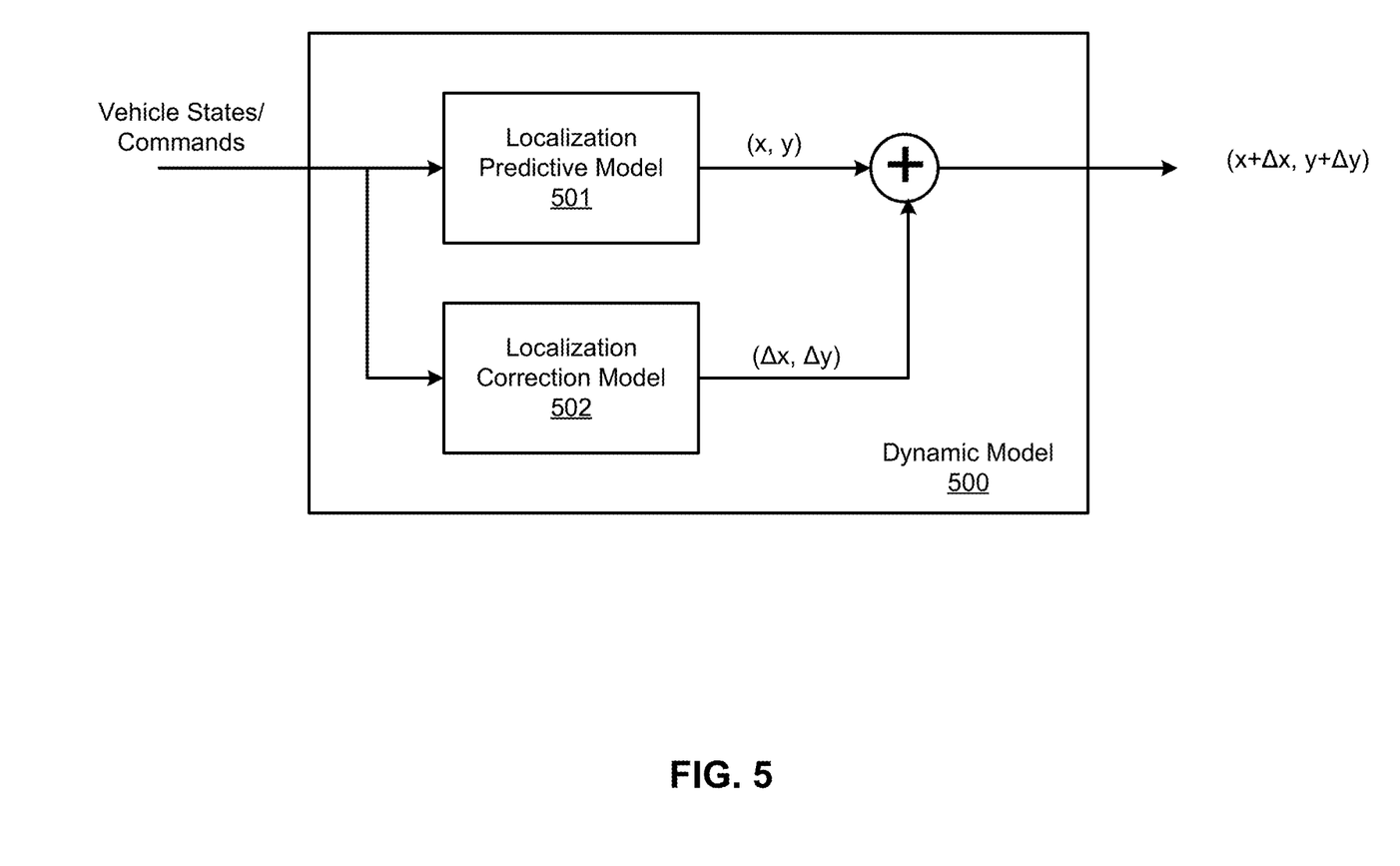
FIG. 5 is a block diagram illustrating an example of a dynamic model according to one embodiment.

FIG. 5 is a block diagram illustrating an example of a dynamic model according to one embodiment. Dynamic model 500 may be trained using at least some of the techniques described above. Referring to FIG. 5, dynamic model 500 includes localization predictive model or module 501 and localization correction module or module 502. Each of these models or modules 501-502 may be individually trained or trained altogether using at least some of the techniques described above. The function of the dynamic model 500 is to predict vehicle's next state (e.g., speed, acceleration, angular velocity of next planning cycle) based the last state (e.g., state of current planning cycle) and control commands (e.g., throttle, brake, steering commands).

Localization predictive model 501 may be a longitudinal model (e.g., linear interpolation), a lateral model (also referred to as a Bicycle model), a neural network (e.g., feed-forward neural network, recurrent neural network). In one embodiment, localization predictive model 501 may predict an acceleration of a vehicle based on the states of the vehicle. Based on the acceleration, the vehicle's velocity and position can be determined by the first order integral and the second order integral. However, due to the double integral calculation, there is a mismatch between the output of localization predictive model 502 and the actual position of the vehicle.

In one embodiment, localization correction model 502 is trained to determine an error between the predicted position of the vehicle using an autonomous driving algorithm, for example, utilized by localization predictive model 501 and the actual position or ground truth of the vehicle. The localization correction model 502 may be trained using a large amount of driving statistics data collected from a large number of vehicles. Typically, in an ideal situation, the vehicle should end at the predicted position by the predictive model. However, due to a variety of circumstantial factors at different driving scenarios or environments (e.g., road condition, vehicle types, weather condition), the actual vehicle position may drift away from the expected or predicted position.

In one embodiment, localization correction model 502 is designed to determine a difference between the expected position of a vehicle in response to a control command and the actual position of the vehicle. The actual position of a vehicle can be determined based on sensor data obtained from sensors such as IMU and/or GPS sensors. By training localization correction model 502 using a large amount of driving statistics data, localization correction model 502 can be utilized in simulation based on the state and control commands of the simulated vehicle. The final predicted position of the vehicle can be determined based on the predicted position (x, y) of localization predictive model 501 and the difference ($\Delta x$, $\Delta y$) determined by localization correction model 502. For example, the final predicted position of the vehicle may be represented by (x+$\Delta x$, y+$\Delta y$).

As a result, the simulated vehicle position is closer to the actual vehicle position under the same or similar driving scenario or driving environment.

Figure 6:
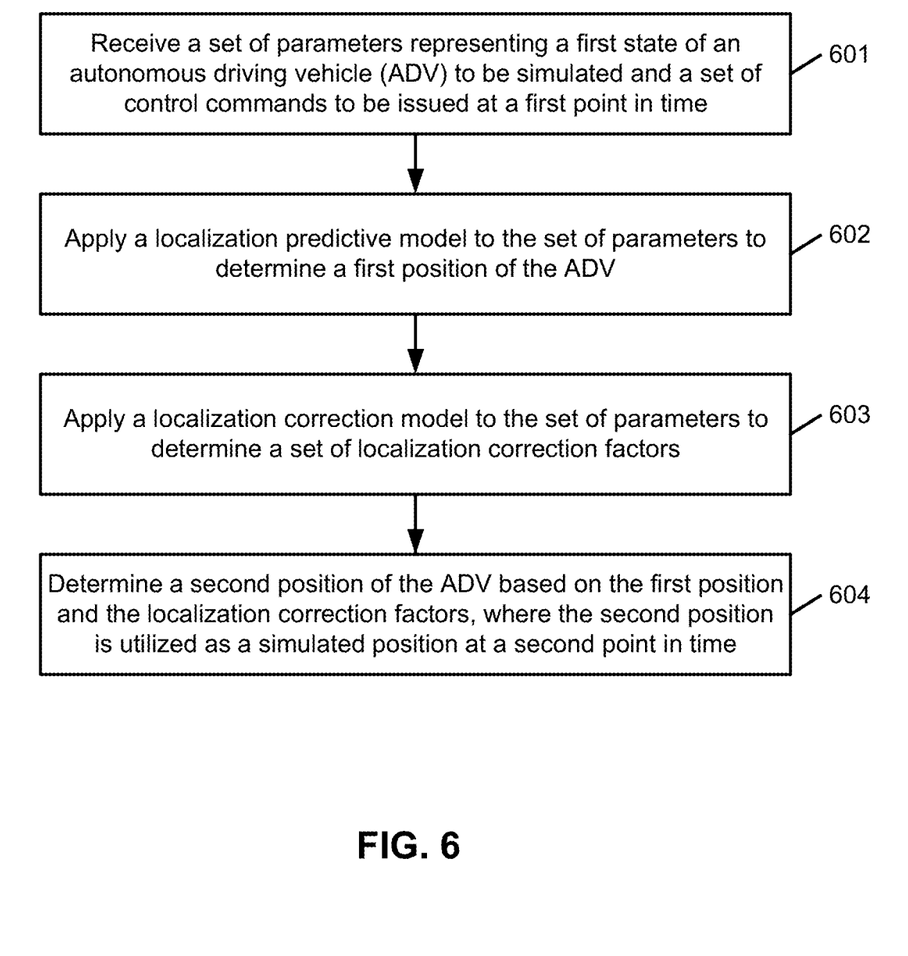
FIG. 6 is a flow diagram illustrating an example of a process for simulating autonomous driving vehicles according to one embodiment.

FIG. 6 is a flow diagram illustrating an example of a process of simulating an autonomous driving vehicle according to one embodiment. Process 600 may be performed by processing logic which may include software, hardware, or a combination thereof. For example, process 600 may be performed as a part of dynamic model 500. Referring to FIG. 6, at block 601, processing logic receives a set of parameters representing a first state of an ADV to be simulated and a set of control commands to be issued at a first point in time. At block 602, processing logic applies a localization predictive model to the set of parameters to determine a first position of the ADV. At block 603, processing logic applies a localization correction model to the set of parameters to determine a set of localization correction factors. At block 604, processing logic applies a second position of the ADV based on the first position and the localization correction factors. The second position is utilized as a simulated position of the ADV at a second point in time.

Figure 7:
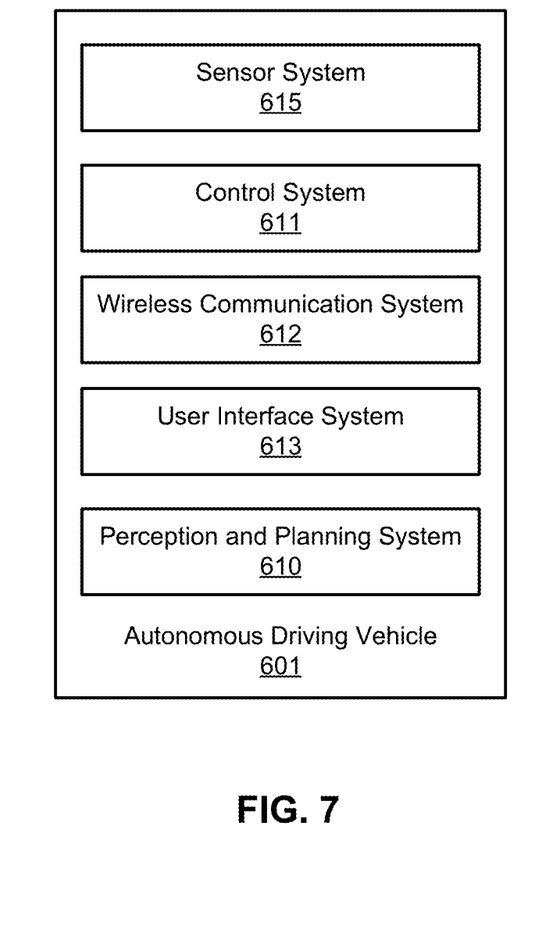
FIG. 7 is a block diagram illustrating an autonomous driving vehicle according to one embodiment.

FIG. 7 is a block diagram illustrating an autonomous driving vehicle according to one embodiment of the disclosure. Referring to FIG. 7, autonomous driving vehicle 601 may be communicatively coupled to one or more servers over a network, which may be any type of networks such as a local area network (LAN), a wide area network (WAN) such as the Internet, a cellular network, a satellite network, or a combination thereof, wired or wireless. The server(s) may be any kind of servers or a cluster of servers, such as Web or cloud servers, application servers, backend servers, or a combination thereof. A server may be a data analytics server, a content server, a traffic information server, a map and point of interest (MPOI) server, or a location server, etc.

An autonomous driving vehicle refers to a vehicle that can be configured to in an autonomous mode in which the vehicle navigates through an environment with little or no input from a driver. Such an autonomous driving vehicle can include a sensor system having one or more sensors that are configured to detect information about the environment in which the vehicle operates. The vehicle and its associated controller(s) use the detected information to navigate through the environment. Autonomous driving vehicle 601 can operate in a manual mode, a full autonomous mode, or a partial autonomous mode.

In one embodiment, autonomous driving vehicle 601 includes, but is not limited to, perception and planning system 610, vehicle control system 611, wireless communication system 612, user interface system 613, and sensor system 615. Autonomous driving vehicle 601 may further include certain common components included in ordinary vehicles, such as, an engine, wheels, steering wheel, transmission, etc., which may be controlled by vehicle control system 611 and/or perception and planning system 610 using a variety of communication signals and/or commands, such as, for example, acceleration signals or commands, deceleration signals or commands, steering signals or commands, braking signals or commands, etc.

Components 610-615 may be communicatively coupled to each other via an interconnect, a bus, a network, or a combination thereof. For example, components 610-615 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 8:
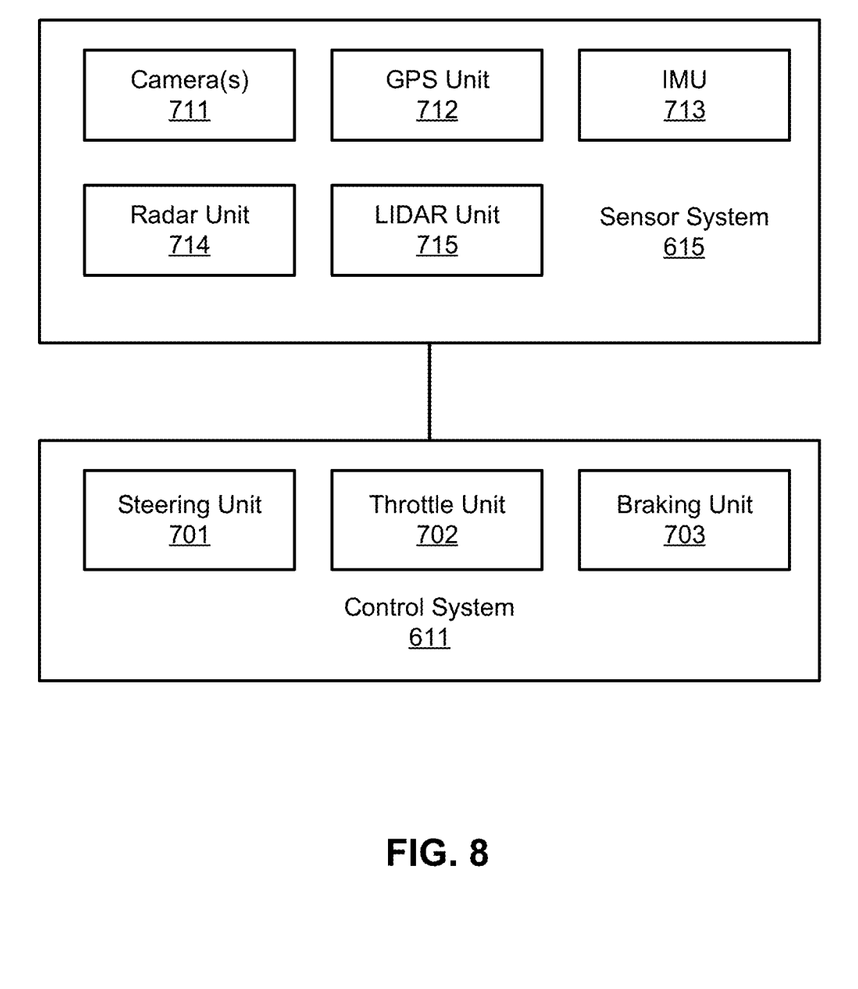
FIG. 8 is a block diagram illustrating an example of an autonomous driving vehicle according to one embodiment.

Referring now to FIG. 8, in one embodiment, sensor system 615 includes, but it is not limited to, one or more cameras 711, global positioning system (GPS) unit 712, inertial measurement unit (IMU) 713, radar unit 714, and a light detection and range (LIDAR) unit 715. GPS system 712 may include a transceiver operable to provide information regarding the position of the autonomous driving vehicle. IMU unit 713 may sense position and orientation changes of the autonomous driving vehicle based on inertial acceleration. Radar unit 714 may represent a system that utilizes radio signals to sense objects within the local environment of the autonomous driving vehicle. In some embodiments, in addition to sensing objects, radar unit 714 may additionally sense the speed and/or heading of the objects. LIDAR unit 715 may sense objects in the environment in which the autonomous driving vehicle is located using lasers. LIDAR unit 715 could include one or more laser sources, a laser scanner, and one or more detectors, among other system components. Cameras 711 may include one or more devices to capture images of the environment surrounding the autonomous driving vehicle. Cameras 711 may be still cameras and/or video cameras. A camera may be mechanically movable, for example, by mounting the camera on a rotating and/or tilting a platform.

Sensor system 615 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous driving vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 611 includes, but is not limited to, steering unit 701, throttle unit 702 (also referred to as an acceleration unit), and braking unit 703. Steering unit 701 is to adjust the direction or heading of the vehicle. Throttle unit 702 is to control the speed of the motor or engine that in turn controls the speed and acceleration of the vehicle. Braking unit 703 is to decelerate the vehicle by providing friction to slow the wheels or tires of the vehicle. Note that the components as shown in FIG. 8 may be implemented in hardware, software, or a combination thereof.

Referring back to FIG. 7, wireless communication system 612 is to allow communication between autonomous driving vehicle 601 and external systems, such as devices, sensors, other vehicles, etc. For example, wireless communication system 612 can wirelessly communicate with one or more devices directly or via a communication network. Wireless communication system 612 can use any cellular communication network or a wireless local area network (WLAN), e.g., using WiFi to communicate with another component or system. Wireless communication system 612 could communicate directly with a device (e.g., a mobile device of a passenger, a display device, a speaker within vehicle 601), for example, using an infrared link, Bluetooth, etc. User interface system 613 may be part of peripheral devices implemented within vehicle 601 including, for example, a keyboard, a touch screen display device, a microphone, and a speaker, etc.

Some or all of the functions of autonomous driving vehicle 601 may be controlled or managed by perception and planning system 610, especially when operating in an autonomous driving mode. Perception and planning system 610 includes the necessary hardware (e.g., processor(s), memory, storage) and software (e.g., operating system, planning and routing programs) to receive information from sensor system 615, control system 611, wireless communication system 612, and/or user interface system 613, process the received information, plan a route or path from a starting point to a destination point, and then drive vehicle 601 based on the planning and control information. Alternatively, perception and planning system 610 may be integrated with vehicle control system 611.

For example, a user as a passenger may specify a starting location and a destination of a trip, for example, via a user interface. Perception and planning system 610 obtains the trip related data. For example, perception and planning system 610 may obtain location and route information from an MPOI server. The location server provides location services and the MPOI server provides map services and the POIs of certain locations. Alternatively, such location and MPOI information may be cached locally in a persistent storage device of perception and planning system 610.

While autonomous driving vehicle 601 is moving along the route, perception and planning system 610 may also obtain real-time traffic information from a traffic information system or server (TIS). Note that the servers may be operated by a third party entity. Alternatively, the functionalities of the servers may be integrated with perception and planning system 610. Based on the real-time traffic information, MPOI information, and location information, as well as real-time local environment data detected or sensed by sensor system 615 (e.g., obstacles, objects, nearby vehicles), perception and planning system 610 can plan an optimal route and drive vehicle 601, for example, via control system 611, according to the planned route to reach the specified destination safely and efficiently.

Figure 9:
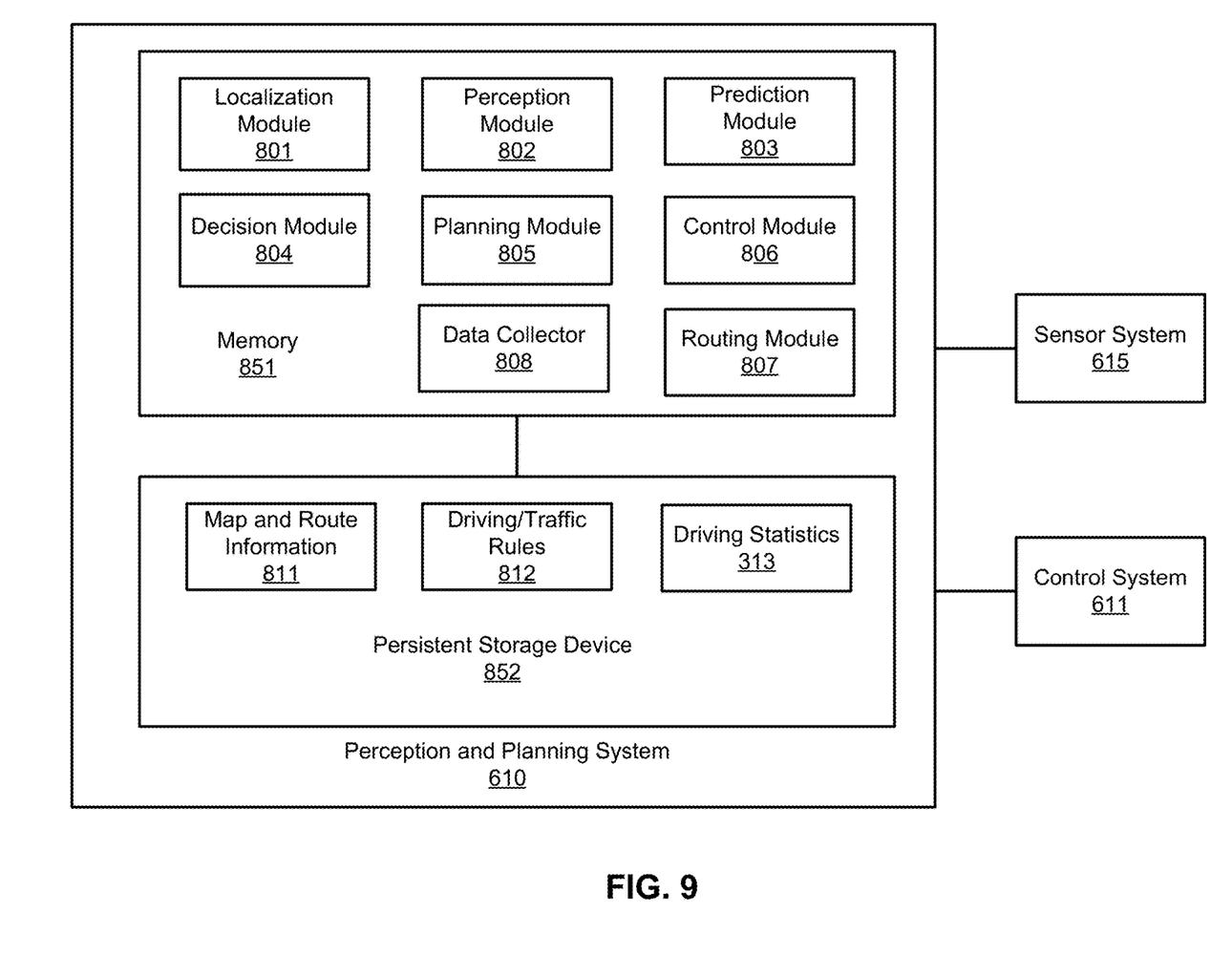
FIG. 9 is a block diagram illustrating an example of a perception and planning system used with an autonomous driving vehicle according to one embodiment.

FIG. 9 is a block diagram illustrating an example of a perception and planning system used with an autonomous driving vehicle according to one embodiment. System 800 may be implemented as a part of autonomous driving vehicle 601 of FIG. 7 including, but is not limited to, perception and planning system 610, control system 611, and sensor system 615. Referring to FIG. 9, perception and planning system 610 includes, but is not limited to, localization module 801, perception module 802, prediction module 803, decision module 804, planning module 805, control module 806, routing module 807, and data collector 808.

Some or all of modules 801-808 may be implemented in software, hardware, or a combination thereof. For example, these modules may be installed in persistent storage device 852, loaded into memory 851, and executed by one or more processors (not shown). Note that some or all of these modules may be communicatively coupled to or integrated with some or all modules of vehicle control system 611 of FIG. 7. Some of modules 801-808 may be integrated together as an integrated module.

Localization module 801 determines a current location of autonomous driving vehicle 300 (e.g., leveraging GPS unit 712) and manages any data related to a trip or route of a user. Localization module 801 (also referred to as a map and route module) manages any data related to a trip or route of a user. A user may log in and specify a starting location and a destination of a trip, for example, via a user interface. Localization module 801 communicates with other components of autonomous driving vehicle 300, such as map and route information 811, to obtain the trip related data. For example, localization module 801 may obtain location and route information from a location server and a map and POI (MPOI) server. A location server provides location services and an MPOI server provides map services and the POIs of certain locations, which may be cached as part of map and route information 811. While autonomous driving vehicle 300 is moving along the route, localization module 801 may also obtain real-time traffic information from a traffic information system or server.

Based on the sensor data provided by sensor system 615 and localization information obtained by localization module 801, a perception of the surrounding environment is determined by perception module 802. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 802 may include a computer vision system or functionalities of a computer vision system to process and analyze images captured by one or more cameras in order to identify objects and/or features in the environment of autonomous driving vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 802 can also detect objects based on other sensors data provided by other sensors such as a radar and/or LIDAR.

For each of the objects, prediction module 803 predicts what the object will behave under the circumstances. The prediction is performed based on the perception data perceiving the driving environment at the point in time in view of a set of map/rout information 811 and traffic rules 812. For example, if the object is a vehicle at an opposing direction and the current driving environment includes an intersection, prediction module 803 will predict whether the vehicle will likely move straight forward or make a turn. If the perception data indicates that the intersection has no traffic light, prediction module 803 may predict that the vehicle may have to fully stop prior to enter the intersection. If the perception data indicates that the vehicle is currently at a left-turn only lane or a right-turn only lane, prediction module 803 may predict that the vehicle will more likely make a left turn or right turn respectively.

For each of the objects, decision module 804 makes a decision regarding how to handle the object. For example, for a particular object (e.g., another vehicle in a crossing route) as well as its metadata describing the object (e.g., a speed, direction, turning angle), decision module 804 decides how to encounter the object (e.g., overtake, yield, stop, pass). Decision module 804 may make such decisions according to a set of rules such as traffic rules or driving rules 812, which may be stored in persistent storage device 852.

Routing module 807 is configured to provide one or more routes or paths from a starting point to a destination point. For a given trip from a start location to a destination location, for example, received from a user, routing module 807 obtains route and map information 811 and determines all possible routes or paths from the starting location to reach the destination location. Routing module 807 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 804 and/or planning module 805. Decision module 804 and/or planning module 805 examine all of the possible routes to select and modify one of the most optimal routes in view of other data provided by other modules such as traffic conditions from localization module 801, driving environment perceived by perception module 802, and traffic condition predicted by prediction module 803. The actual path or route for controlling the ADV may be close to or different from the reference line provided by routing module 807 dependent upon the specific driving environment at the point in time.

Based on a decision for each of the objects perceived, planning module 805 plans a path or route for the autonomous driving vehicle, as well as driving parameters (e.g., distance, speed, and/or turning angle), using a reference line provided by routing module 807 as a basis. That is, for a given object, decision module 804 decides what to do with the object, while planning module 805 determines how to do it. For example, for a given object, decision module 804 may decide to pass the object, while planning module 805 may determine whether to pass on the left side or right side of the object. Planning and control data is generated by planning module 805 including information describing how vehicle 300 would move in a next moving cycle (e.g., next route/ path segment). For example, the planning and control data may instruct vehicle 300 to move 10 meters at a speed of 30 miles per hour (mph), then change to a right lane at the speed of 25 mph.

Based on the planning and control data, control module 806 controls and drives the autonomous driving vehicle, by sending proper commands or signals to vehicle control system 611, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 805 plans a next route segment or path segment, for example, including a target position and the time required for the ADV to reach the target position. Alternatively, planning module 805 may further specify the specific speed, direction, and/or steering angle, etc. In one embodiment, planning module 805 plans a route segment or path segment for the next predetermined period of time such as 5 seconds. For each planning cycle, planning module 805 plans a target position for the current cycle (e.g., next 5 seconds) based on a target position planned in a previous cycle. Control module 806 then generates one or more control commands (e.g., throttle, brake, steering control commands) based on the planning and control data of the current cycle.

Note that decision module 804 and planning module 805 may be integrated as an integrated module. Decision module 804/planning module 805 may include a navigation system or functionalities of a navigation system to determine a driving path for the autonomous driving vehicle. For example, the navigation system may determine a series of speeds and directional headings to affect movement of the autonomous driving vehicle along a path that substantially avoids perceived obstacles while generally advancing the autonomous driving vehicle along a roadway-based path leading to an ultimate destination. The destination may be set according to user inputs via user interface system 613. The navigation system may update the driving path dynamically while the autonomous driving vehicle is in operation. The navigation system can incorporate data from a GPS system and one or more maps so as to determine the driving path for the autonomous driving vehicle.

According to one embodiment, data collector 808 is configured to collect driving statistics data and store the same in persistent storage device 852 as a part of driving statistics 313. Driving statistics 313 can then be utilized for training a dynamic model as described above.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method for simulating an autonomous driving vehicle, the method comprising:
   receiving a set of parameters representing a first state of an autonomous driving vehicle (ADV) to be simulated and a set of control commands to be issued at a first point in time;
   applying a localization predictive model to the set of parameters to determine a first position of the ADV;
   applying a localization correction model to the set of parameters to determine a set of localization correction factors; and
   determining a second position of the ADV based on the first position and the localization correction factors, wherein the second position is utilized as a simulated position of the ADV at a second point in time.

2. The method of claim 1, wherein the first state of the ADV includes a speed, an acceleration, and an angular velocity of the ADV at the first point in time.

3. The method of claim 1, wherein the set of control commands comprises at least one of a throttle command, a brake command, or a steering command.

4. The method of claim 1, wherein the localization correction model was trained based on a large amount of driving statistics data collected from a plurality of vehicles.

5. The method of claim 4, wherein the driving statistics data comprises vehicle states of the vehicles in response to different control commands issued at different points in time over a period of time.

6. The method of claim 4, wherein the localization correction model is to determine a difference between an expected position of a vehicle based on a localization process of an autonomous driving system and an actual position of the vehicle determined based on sensor data obtained from a plurality of sensors mounted on the vehicle.

7. The method of claim 6, wherein the difference between the expected position and the actual position is utilized to calibrate the first position determined by the localization predictive model.

8. A non-transitory machine-readable medium having instructions stored therein, which when executed by a processor, cause the processor to perform operations, the operations comprising:
   receiving a set of parameters representing a first state of an autonomous driving vehicle (ADV) to be simulated and a set of control commands to be issued at a first point in time;

applying a localization predictive model to the set of parameters to determine a first position of the ADV;

applying a localization correction model to the set of parameters to determine a set of localization correction factors; and determining a second position of the ADV based on the first position and the localization correction factors, wherein the second position is utilized as a simulated position of the ADV at a second point in time.

9. The machine-readable medium of claim 8, wherein the first state of the ADV includes a speed, an acceleration, and an angular velocity of the ADV at the first point in time.

10. The machine-readable medium of claim 8, wherein the set of control commands comprises at least one of a throttle command, a brake command, or a steering command.

11. The machine-readable medium of claim 8, wherein the localization correction model was trained based on a large amount of driving statistics data collected from a plurality of vehicles.

12. The machine-readable medium of claim 11, wherein the driving statistics data comprises vehicle states of the vehicles in response to different control commands issued at different points in time over a period of time.

13. The machine-readable medium of claim 11, wherein the localization correction model is to determine a difference between an expected position of a vehicle based on a localization process of an autonomous driving system and an actual position of the vehicle determined based on sensor data obtained from a plurality of sensors mounted on the vehicle.

14. The machine-readable medium of claim 13, wherein the difference between the expected position and the actual position is utilized to calibrate the first position determined by the localization predictive model.

15. A data processing system, comprising:
a processor; and
a memory coupled to the processor to store instructions, which when executed by the processor, cause the processor to perform operations, the operations including:

receiving a set of parameters representing a first state of an autonomous driving vehicle (ADV) to be simulated and a set of control commands to be issued at a first point in time, applying a localization predictive model to the set of parameters to determine a first position of the ADV, applying a localization correction model to the set of parameters to determine a set of localization correction factors, and determining a second position of the ADV based on the first position and the localization correction factors, wherein the second position is utilized as a simulated position of the ADV at a second point in time.

16. The system of claim 15, wherein the first state of the ADV includes a speed, an acceleration, and an angular velocity of the ADV at the first point in time.

17. The system of claim 15, wherein the set of control commands comprises at least one of a throttle command, a brake command, or a steering command.

18. The system of claim 15, wherein the localization correction model was trained based on a large amount of driving statistics data collected from a plurality of vehicles.

19. The system of claim 18, wherein the driving statistics data comprises vehicle states of the vehicles in response to different control commands issued at different points in time over a period of time.

20. The system of claim 18, wherein the localization correction model is to determine a difference between an expected position of a vehicle based on a localization process of an autonomous driving system and an actual position of the vehicle determined based on sensor data obtained from a plurality of sensors mounted on the vehicle.

* * * * *